United States Patent
Chen et al.

(10) Patent No.: US 6,833,081 B2
(45) Date of Patent: Dec. 21, 2004

(54) METHOD OF METAL ETCHING POST CLEANING

(75) Inventors: Yi-Nan Chen, Taipei (TW); Hui Min Mao, Tainan Hsien (TW); Shih-Chieh Kao, Keelung (TW); Tien-Sung Chen, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 206 days.

(21) Appl. No.: 10/193,502

(22) Filed: Jul. 10, 2002

(65) Prior Publication Data

US 2003/0116534 A1 Jun. 26, 2003

(30) Foreign Application Priority Data

Dec. 21, 2001 (TW) .......................... 90131939 A

(51) Int. Cl.$^7$ .......................... B08B 7/00; C03C 15/00; B44C 1/22
(52) U.S. Cl. .......................... 216/100; 216/67; 216/83; 134/1; 134/1.3; 134/2; 134/3; 510/175
(58) Field of Search .......................... 216/67, 83, 100; 134/1, 1.3, 226, 26; 438/906; 510/175

(56) References Cited

U.S. PATENT DOCUMENTS

| | | | | |
|---|---|---|---|---|
| 6,032,682 A | * | 3/2000 | Verhaverbeke | 134/1.3 |
| 6,082,374 A | * | 7/2000 | Huffman et al. | 134/1.1 |
| 6,191,086 B1 | * | 2/2001 | Leon et al. | 510/175 |
| 6,197,210 B1 | * | 3/2001 | Myerson | 216/106 |
| 6,265,309 B1 | * | 7/2001 | Gotoh et al. | 438/637 |
| 2002/0083961 A1 | * | 7/2002 | Tsuga | 134/1.3 |

* cited by examiner

Primary Examiner—Nadine G. Norton
Assistant Examiner—Shamim Ahmed
(74) Attorney, Agent, or Firm—Ladas & Parry

(57) ABSTRACT

A method of metal etching post cleaning. A substrate with a surface covered by a patterned metal layer and a patterned resist layer in order is provided, subsequently, oxygen-plasma ashing is performed to remove the patterned resist layer to expose the surface of the patterned metal layer. Next, an ozone-plasma ashing is performed to release charges on the surface of the patterned metal layer, the ozone-plasma ashing time at 30 sec~180 sec, and the ozone-plasma ashing temperature at 200° C.~300° C. The surface of the patterned metal layer is finally cleaned with sulfuric peroxide, molar concentration of sulfuric acid and hydrogen peroxide therein being 0.07M~0.4M and 0.8M~1.5M, respectively. In addition, the temperature of the sulfuric peroxide during post cleaning is 25° C.~50° C.

19 Claims, 3 Drawing Sheets

METHOD OF METAL ETCHING POST CLEANING

BACKGROUND OF THE INVENTION

1. Field of the Invention

The present invention relates in general to a cleaning process. In particular, the present invention relates to a method of metal etching post cleaning, the application of which prevents damage to devices and effectively reduces cleaning costs.

2. Description of the Related Art

Generally, in semiconductor processing, methods of removing photoresist are wet stripping and dry stripping. Wet stripping uses chemical solvent to dissolve the patterned photoresist, and dry stripping uses high energy plasma to bombard the patterned photoresist or thermally remove the resist in oxygen atmosphere at high temperature (i.e. oxygen-plasma ashing).

It is possible to damage the substrate and metal exposed under the trench or via (contact hole) and profile of the trench or via by wet stripping. Accordingly, ashing has become the main method to strip photoresist in recent years. That is, the photoresist, in an oxygen atmosphere under high pressure and temperature, is oxidized so as to be eliminated by a vacuum pump. However, both polymer residue and accumulating charges are easily created on the surface of patterned metal layers during the metal etching and post cleaning, and are unfavorable for the next stage of the process. It is very difficult to completely remove the residual surface polymer using only plasma ashing because of insoluble metal oxides forming.

Accordingly, after conventional ashing is performed, it is necessary to use a cleaning agent such as ACT935 (organic amine solvent) to remove polymer residue. However, this agent creates higher costs.

Seeking to solve this problem, mixtures of sulfuric peroxide (e.g. 0.9M sulfuric acid and 1.18M hydrogen peroxide) and dilute hydrofluoric acid (DHF) are used as cleaning agents because of lower costs. However, this cleaning agent easily corrodes the metal in post-ash residue cleaning, thereby reducing the reliability of devices.

Therefore, the present invention is to provide a method of metal etching post cleaning performing another ashing by ozone ($O_3$) to release accumulating charges. Moreover, the mixtures of 0.07M~0.4M sulfuric acid ($H_2SO_4$) and 0.8M~1.5M hydrogen peroxide ($H_2O_2$) are used as a cleaning agent to completely remove polymer residue and prevent damage to metal, thereby ensuring reliability of devices.

SUMMARY OF THE INVENTION

An object of the present invention is to provide a method of metal etching post cleaning to reduce the molar concentration of the sulfuric acid, thereby preventing damage to metal during post cleaning to increase reliability of devices.

It is another object of the present invention is to provide a method of metal etching post cleaning comprising an ashing by ozone to release charges created during metal etching post cleaning.

In accordance with the objects of this invention, a method of metal etching post cleaning is provided and includes steps of: providing a substrate with a surface covered by a patterned metal layer and a patterned resist layer in order; performing a first ashing to remove the patterned resist layer to expose the surface of the patterned metal layer; and cleaning the surface of the patterned metal layer with sulfuric peroxide, wherein the concentration of sulfuric acid and hydrogen peroxide in the sulfuric peroxide are 0.07M~0.4M and 0.8M~1.5M, respectively. In addition, the temperature during cleaning by the sulfuric peroxide is 25° C.~50° C. Moreover, the method further includes a step of performing a second ashing by ozone, wherein the treating time is 30 sec~180 sec, and the treating temperature is 200° C.~300° C.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

FIGS. 1 to 5 are sectional diagrams showing a method of metal etching post cleaning according to the present invention.

Figure 1:
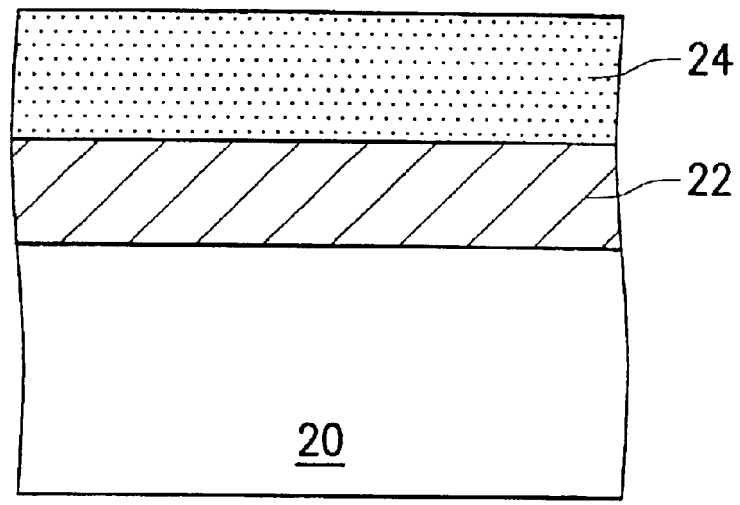
FIGS. 1 to 5 are sectional diagrams showing a method of metal etching post cleaning according to the present invention.

In FIG. 1, a substrate 20 such as a silicon wafer is provided, and there are semiconductor devices formed on the substrate 20 (not shown). Subsequently, using deposition, a metal layer 22 such as aluminum (Al) and a resist layer 24 are formed on the substrate 20 in order.

Figure 2:
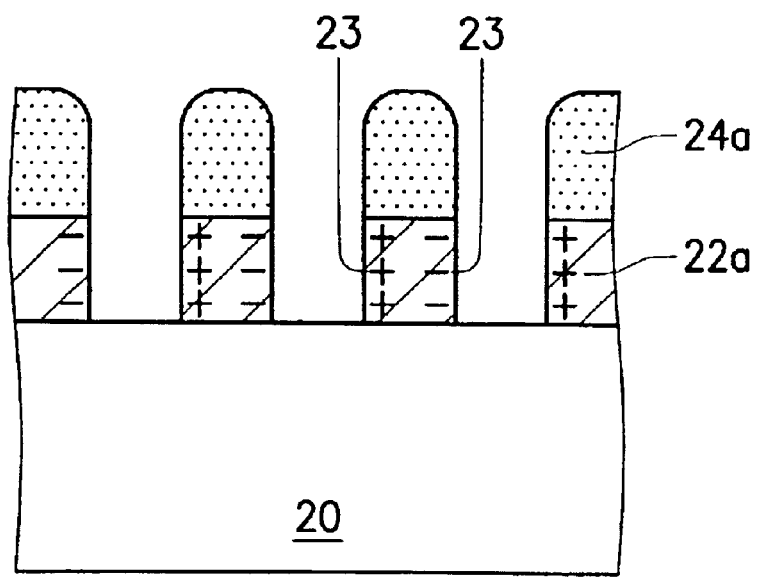

In FIG. 2, using conventional photolithography and etching, a plurality of patterned resist layers 24a and patterned aluminum layers 22a are formed on the substrate 20 in order. Symbol + and − in FIG. 2 respectively represent positive charge 23 and negative charge 23 created and accumulating on the surface of patterned aluminum layers 22a during metal etching.

Figure 3:
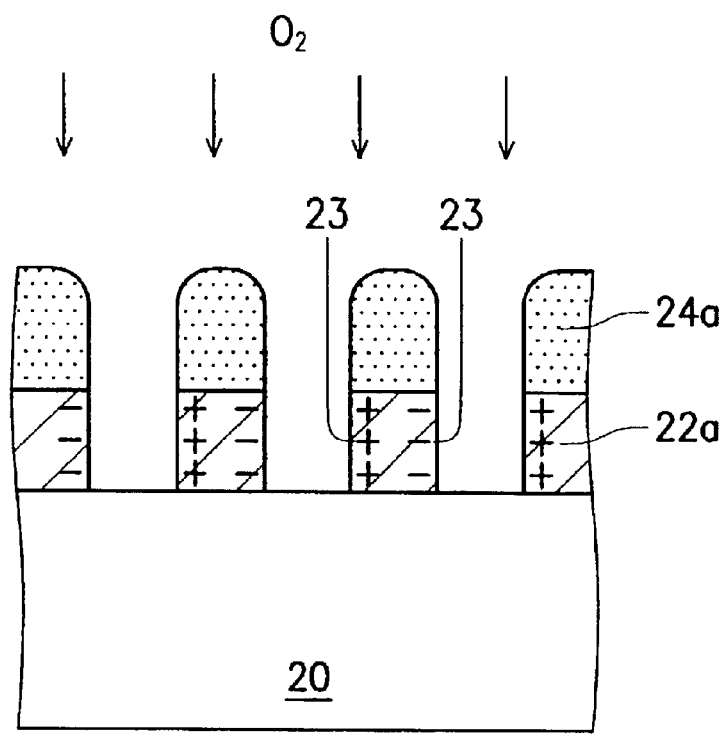

In FIG. 3, a first ashing is performed using oxygen as a chemical reaction gas to remove the patterned resist layers 24a on the patterned aluminum layers 22a.

Figure 4:
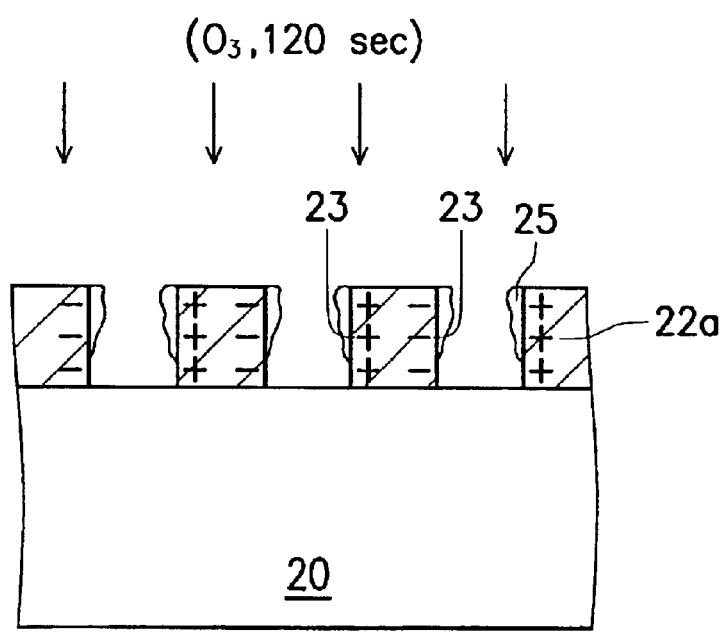

In FIG. 4, after the resist layers 24a are removed, the surface of aluminum layers 22a exposed retains polymer residue 25 created during the first ashing and accumulates charges created during aluminum layer 22 etching. Accordingly, in this embodiment, a second ashing is performed using ozone to release the charges 23 accumulated on the surface of the patterned aluminum layers 22a.Here, the second ashing temperature is 200° C.~300° C. Moreover, the second ashing time is 30 sec~180 sec, and 120 sec is preferred. Hence, aluminum oxide ($Al_2O_3$) thin layer (not shown) is formed on the surface of the patterned aluminum layers 22a by a reaction between aluminum and ozone at high temperature. The object of this is described later.

Figure 5:
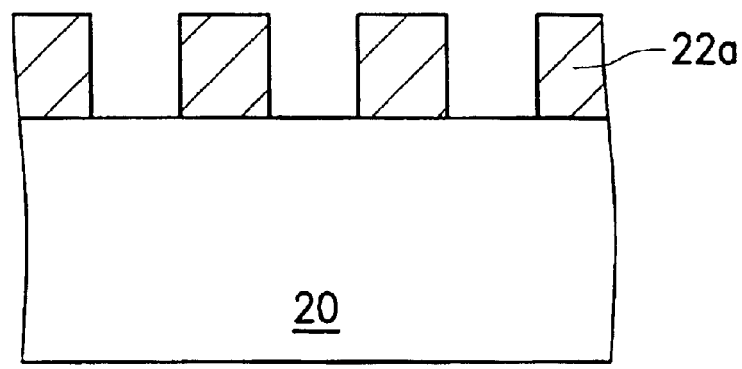

In FIG. 5, the mixtures of sulfuric peroxide (i.e. sulfuric acid and hydrogen peroxide) and deionized water (DIW) are used as a cleaning agent to cleaning the aluminum layers 22a, thereby removing polymer residue 25 as mentioned above. In this embodiment, the molar concentration of sulfuric acid contained in the sulfuric peroxide is 0.07M~0.4M, and 0.13M is preferred. Moreover, the molar concentration of hydrogen peroxide contained in the sulfuric peroxide is 0.8M~1.5M, and 1.18M is preferred. In addition, the temperature of sulfuric peroxide during post cleaning is 25° C.~50° C., and 34° C. is preferred. Hence, it is effective to remove polymer residue 25.

Compared with the metal etching post cleaning in the prior art, since the present invention uses a cleaning agent having dilute sulfuric peroxide (DSP) without hydrofluoric acid (HF), it is effective to remove polymer residue. In addition, the aluminum oxide thin layer as mentioned above is as a protective layer to avoid aluminum layers corroding, so as to increase the reliability of devices.

Finally, while the invention has been described by way of example and in terms of the preferred embodiment, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of metal etching post cleaning, comprising:
   providing a substrate with a surface covered by a patterned metal layer and a patterned resist layer;
   performing a first ashing to remove the patterned resist layer to expose the surface of the patterned metal layer; and
   cleaning the surface of the patterned metal layer by sulfuric peroxide, wherein the concentration of sulfuric acid in the sulfuric peroxide is 0.07M~0.4M.

2. The method as claimed in claim 1, wherein the patterned metal layer is a patterned aluminum layer.

3. The method as claimed in claim 1, wherein the first ashing is performed using oxygen.

4. The method as claimed in claim 1, further comprising performing a second ashing after the first ashing is finished to release the charges on the surface of the patterned metal layer.

5. The method as claimed in claim 1, wherein the sulfuric peroxide is mixed with deionized water.

6. The method as claimed in claim 1, wherein the temperature of the sulfuric peroxide is 25° C.~50° C.

7. The method as claimed in claim 1, wherein the concentration of hydrogen peroxide in the sulfuric peroxide is 0.8M~1.5M.

8. The method as claimed in claim 4, wherein the second ashing is performed using ozone.

9. The method as claimed in claim 4, wherein the second ashing time is 30 sec~180 sec.

10. The method as claimed in claim 4, wherein the second ashing temperature is 200° C.~300° C.

11. A method of metal etching post cleaning, comprising:
    providing a substrate with a surface covered by a plurality of patterned aluminum layers and a plurality of patterned resist layers;
    performing a first ashing to remove the patterned resist layers to expose the surface of the patterned aluminum layers;
    performing a second ashing to release the charges on the surface of the patterned aluminum layers; and
    cleaning the surface of the patterned aluminum layers by sulfuric peroxide, wherein the concentration of sulfuric acid in the sulfuric peroxide is 0.13M.

12. The method as claimed in claim 11, wherein the first ashing is performed using oxygen.

13. The method as claimed in claim 11, wherein the second ashing is performed using ozone.

14. The method as claimed in claim 11, wherein the concentration of hydrogen peroxide in the sulfuric peroxide is 1.18M.

15. The method as claimed in claim 11, wherein the sulfuric peroxide is mixed with deionized water.

16. The method as claimed in claim 11, wherein the temperature of the sulfuric peroxide is 34° C.

17. The method as claimed in claim 11, wherein the second ashing time is 120 sec.

18. The method as claimed as claim 11, wherein the second ashing temperature is 200° C.~300° C.

19. A method of metal etching post cleaning, comprising:
    providing a substrate with a surface covered by a plurality of patterned aluminum layers and a plurality of patterned resist layers;
    performing a first ashing using oxygen to remove the patterned resist layers to expose the surface of the patterned aluminum layers;
    performing a second ashing using ozone to release the charges on the surface of the patterned aluminum layers; and
    cleaning the surface of the patterned aluminum layers by sulfuric peroxide, wherein the concentration of sulfuric acid in the sulfuric peroxide is 0.07M~0.4M.

* * * * *